United States Patent
Koizuka et al.

(10) Patent No.: US 9,243,855 B2
(45) Date of Patent: Jan. 26, 2016

(54) COOLING STRUCTURE, VORTEX-FLOW FORMING PLATE MOLDING APPARATUS, AND METHOD FOR MOLDING VORTEX-FLOW GENERATING PORTION

(71) Applicant: NISSAN MOTOR CO., LTD., Yokohama-shi, Kanagawa (JP)

(72) Inventors: Yousuke Koizuka, Kanagawa (JP); Tatsuomi Nakayama, Kanagawa (JP); Ichiro Ishikawa, Kanagawa (JP)

(73) Assignee: NISSAN MOTOR CO., LTD., Yokohama-shi, Kanagawa (JP)

( * ) Notice: Subject to any disclaimer, the term of this patent is extended or adjusted under 35 U.S.C. 154(b) by 0 days.

(21) Appl. No.: 14/390,667

(22) PCT Filed: Mar. 15, 2013

(86) PCT No.: PCT/JP2013/057472
§ 371 (c)(1),
(2) Date: Oct. 3, 2014

(87) PCT Pub. No.: WO2013/153914
PCT Pub. Date: Oct. 17, 2013

(65) Prior Publication Data
US 2015/0168084 A1    Jun. 18, 2015

(30) Foreign Application Priority Data

Apr. 10, 2012  (JP) ................................ 2012-089202
Mar. 5, 2013   (JP) ................................ 2013-042572

(51) Int. Cl.
*F28F 13/12*   (2006.01)
*H05K 7/20*    (2006.01)
(Continued)

(52) U.S. Cl.
CPC ................ *F28F 13/06* (2013.01); *B23P 15/00* (2013.01); *H01L 23/473* (2013.01); *H01L 24/32* (2013.01);

(Continued)

(58) Field of Classification Search
CPC ............. H01L 23/473; H05K 7/20254; H05K 7/20263; H05K 7/20509; H05K 7/20927; F28F 13/12
See application file for complete search history.

(56) References Cited

U.S. PATENT DOCUMENTS 4,984,066 A * 1/1991 Iversen ......................... 257/714
4,989,070 A * 1/1991 Iversen et al. ................. 361/699

(Continued)

FOREIGN PATENT DOCUMENTS

| JP | 2003008264 A | 1/2003 |
|---|---|---|
| JP | 2006100293 A | 4/2006 |
| JP | 2006261555 A | 9/2006 |
| JP | 2008071800 A | 3/2008 |

(Continued)

OTHER PUBLICATIONS

Kim Kyung Min et al: "Optimal design of transverse ribs in tubes for thermal performance enhancement", Energy, Pergamon Press, Oxford, GB, vol. 35, No. 6, Mar. 25, 2010, pp. 2400-2406, XP028987920.

(Continued)

*Primary Examiner* — Leonard R Leo
(74) *Attorney, Agent, or Firm* — Young Basile

(57) ABSTRACT

A cooling structure for cooling a heat generating element allows cooling fluid to circulate around the heat generating element or a base material with the heat generating element disposed thereon. The cooling structure is provided with a vortex-flow generating portion which extends in a direction intersecting a circulation direction of the cooling fluid, and which generates a vortex flow depending on the flow rate of cooling fluid.

12 Claims, 13 Drawing Sheets

(51) Int. Cl.
*F28F 13/06* (2006.01)
*H01L 23/473* (2006.01)
*H01L 23/00* (2006.01)
*B23P 15/00* (2006.01)
*H01L 23/373* (2006.01)

(52) U.S. Cl.
CPC ........ *H05K 7/20254* (2013.01); *H01L 23/3735* (2013.01); *Y10T 29/37* (2015.01); *Y10T 29/49316* (2015.01)

(56) References Cited

U.S. PATENT DOCUMENTS

| | | | | |
|---|---|---|---|---|
| 5,001,548 A | * | 3/1991 | Iversen | 257/714 |
| 5,003,376 A | * | 3/1991 | Iversen | 257/714 |
| 5,111,280 A | * | 5/1992 | Iversen | 257/714 |
| 5,239,200 A | * | 8/1993 | Messina et al. | 257/714 |
| 7,204,299 B2 | * | 4/2007 | Bhatti et al. | 165/80.4 |
| 7,578,337 B2 | * | 8/2009 | Spokoiny et al. | 165/80.4 |
| 2004/0184237 A1 | * | 9/2004 | Chang | 361/699 |
| 2007/0062674 A1 | | 3/2007 | Ippoushi et al. | |
| 2011/0180236 A1 | * | 7/2011 | Krasnov | 165/104.19 |

FOREIGN PATENT DOCUMENTS

| | | |
|---|---|---|
| JP | 2008091700 A | 4/2008 |
| JP | 2010021311 A | 1/2010 |

OTHER PUBLICATIONS

Translation of the International Preliminary Report on Patentability with the original IPRP dated Sep. 18, 2013 for International Application No. PCT/JP2013/057472.

* cited by examiner

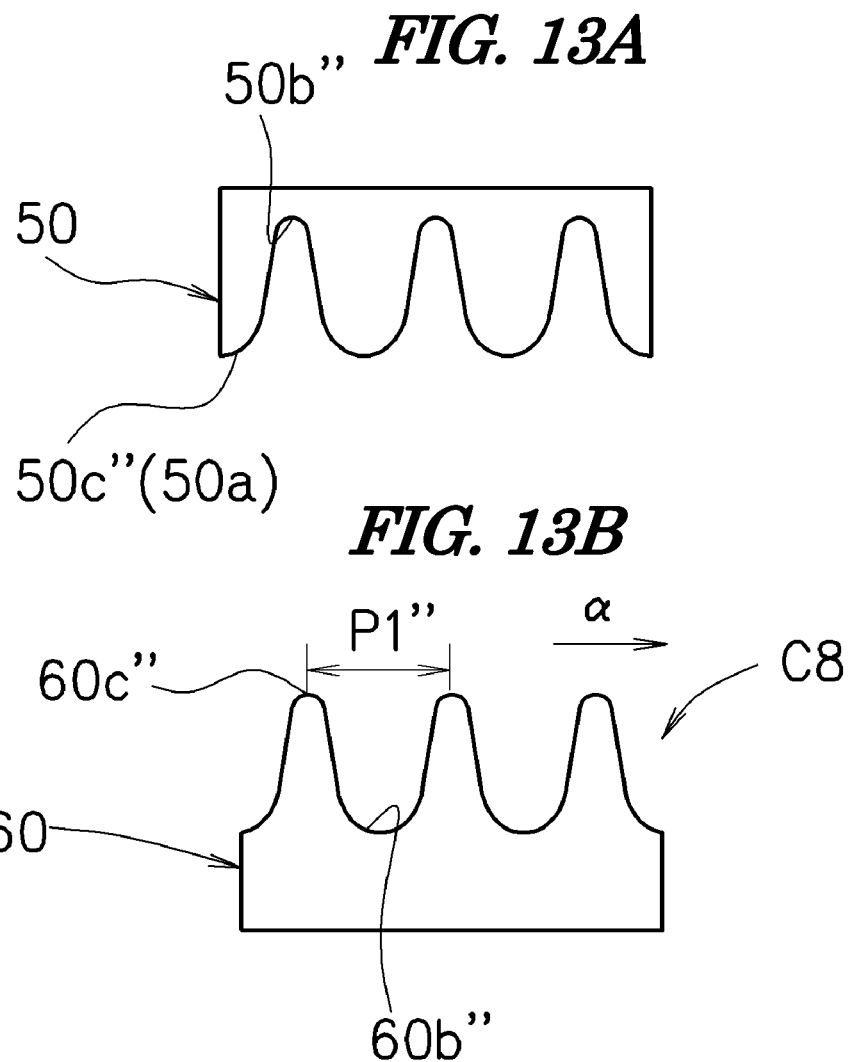

though shown upside down, FIG. 8B is a cross-sectional view taken along the line of FIG. 8A.

COOLING STRUCTURE, VORTEX-FLOW FORMING PLATE MOLDING APPARATUS, AND METHOD FOR MOLDING VORTEX-FLOW GENERATING PORTION

CROSS REFERENCE TO RELATED APPLICATIONS

This application claims priority to Japanese Patent Application Serial No. 2012-089202, filed Apr. 10, 2012, and 2013-042572, filed Mar. 5, 2013, each incorporated herein in its entirety.

TECHNICAL FIELD

The present invention relates to a cooling structure for cooling electronic devices, such as a semiconductor or a motor, a vortex-flow forming plate molding apparatus, and a method for molding a vortex-flow generating portion.

BACKGROUND

This kind of technology in the prior art includes a "cooling device" as disclosed in Japanese Patent Unexamined Publication No. 2003-8264. The cooling device disclosed in Japanese Patent Unexamined Publication No. 2003-8264 includes a plurality of heat dissipation members extending in the direction away from an electronic component. Cooling fluid is allowed to pass through between the respective heat dissipation members, thereby cooling the electronic component. The heat dissipation member is designed to have its length decreased as the heat transfer temperature of heat generated by the electronic component becomes lower.

It is described that the heat dissipation members are formed to become shorter from the center of the electric component toward the end thereof and along the flow direction of the cooling fluid.

However, the cooling device disclosed in the above Japanese Patent Unexamined Publication No. 2003-8264 includes the heat dissipation members extending in the direction away from the electronic component, and is designed to cool the electronic component by increasing a flow contact area with the heat dissipation member, which might inhibit reduction in size of the cooling device.

SUMMARY

Accordingly, it is an object of the present invention to provide a cooling structure, a molding apparatus for a vortex-flow forming plate, and a method for molding a vortex-flow forming plate that can reduce a loss in pressure and improve the heat conductivity while reducing its size.

In order to solve the foregoing problems, a cooling structure according to the present invention is adapted to cool a heat generating element by allowing a cooling fluid to circulate around the heat generating element or a base material with the heat generating element disposed thereon. The cooling structure includes a vortex-flow generating portion, which extends in a direction intersecting a circulation direction of the cooling fluid, and which generates a vortex flow in accordance with a flow rate of the cooling fluid. The vortex-flow generating portion includes a plurality of concave portions arranged at predetermined intervals. In the cooling structure of the present invention, $W^+ = W u_\tau / v$ is set within a range of 25 to 300, where $W^+ = W u_\tau / v$ is a value given by non-dimensionalizing an opening width W of a concave portion by using a shear rate of $u_\tau = (t_\omega / \rho)^{1/2}$ calculated from a shear stress $\tau_\omega$ and a fluid density $\rho$; an experimental formula of a pipe friction coefficient, represented by $C_f = t_\omega / (0.5 \rho u^2) = 0.73 \, Re^{-0.25}$ calculated from a flow rate u, the fluid density $\rho$, and the Reynolds number Re; and a kinematic viscosity v.

In order to solve the above problems, a vortex-flow forming plate molding apparatus according to the present invention is adapted to mold a vortex-flow generating portion, which is formed on the cooling structure described above, on a vortex-flow forming plate. In the present invention, the molding apparatus includes: a vertically movable upper die to form the vortex-flow generating portion; a fixed lower die; a sleeve for pressing an outer peripheral edge of the vortex-flow forming plate disposed between the upper die and the lower die; and a back-pressure applicator, which applies a back pressure to between the sleeve and the lower die. The outer peripheral edge of the vortex-flow forming plate is pressed via the back pressure applied by the sleeve and the lower die, and the vortex-flow generating portion is molded on the vortex-flow forming plate by the upper die and the lower die.

In order to solve the above problems, a method for molding a vortex-flow generating portion according to the present invention uses the molding apparatus for the vortex-flow forming plate as described above. In the present invention, the outer peripheral edge of the vortex-flow forming plate, disposed between the upper die and the lower die, is pressed by applying the back pressure via the sleeve and the lower die, and the vortex-flow generating portion is molded on the vortex-flow forming plate by the upper die and the lower die.

According to the present invention, the vortex-flow generating portion is provided which extends in the direction intersecting the circulation direction of the cooling fluid, and which generates a vortex flow depending on the flow rate of the cooling fluid. Therefore, reduction of a loss in pressure and improvement of the heat conductivity is achieved, while reducing the size and simplifying the structure.

BRIEF DESCRIPTION OF DRAWINGS

FIG. 13A is a partial enlarged cross-sectional view of a molding part formed in an upper die for molding the vortex-flow generating portion, and FIG. 13B is an enlarged view of a vortex-flow generating portion in a third other example corresponding to the part of the vortex-flow generating portion enclosed by the line III in FIG. 2.

DESCRIPTION OF EMBODIMENTS

Figure 1:
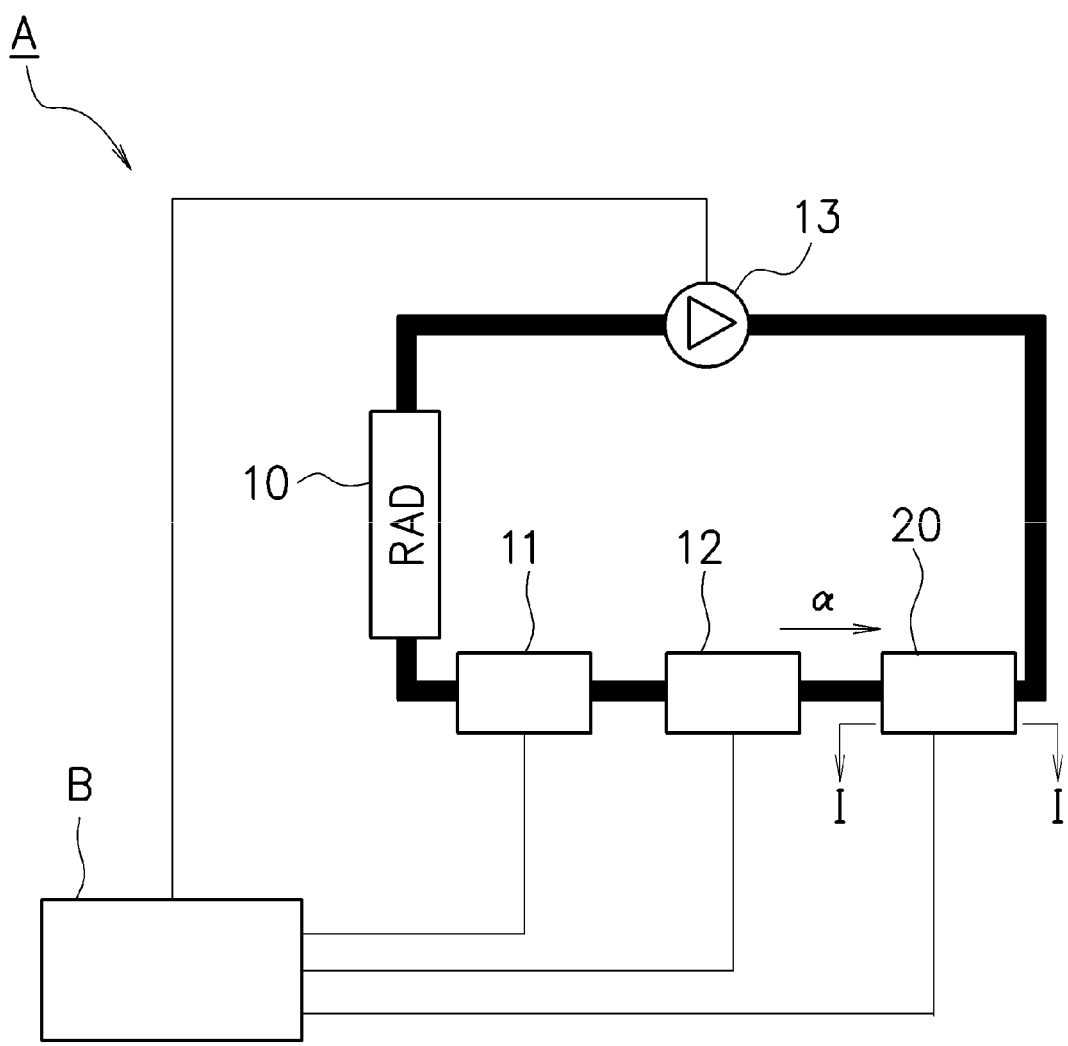
FIG. 1 is an explanatory diagram showing the structure of a cooling system to which a cooling structure according to one embodiment of the present invention is applied.
Figure 2A:
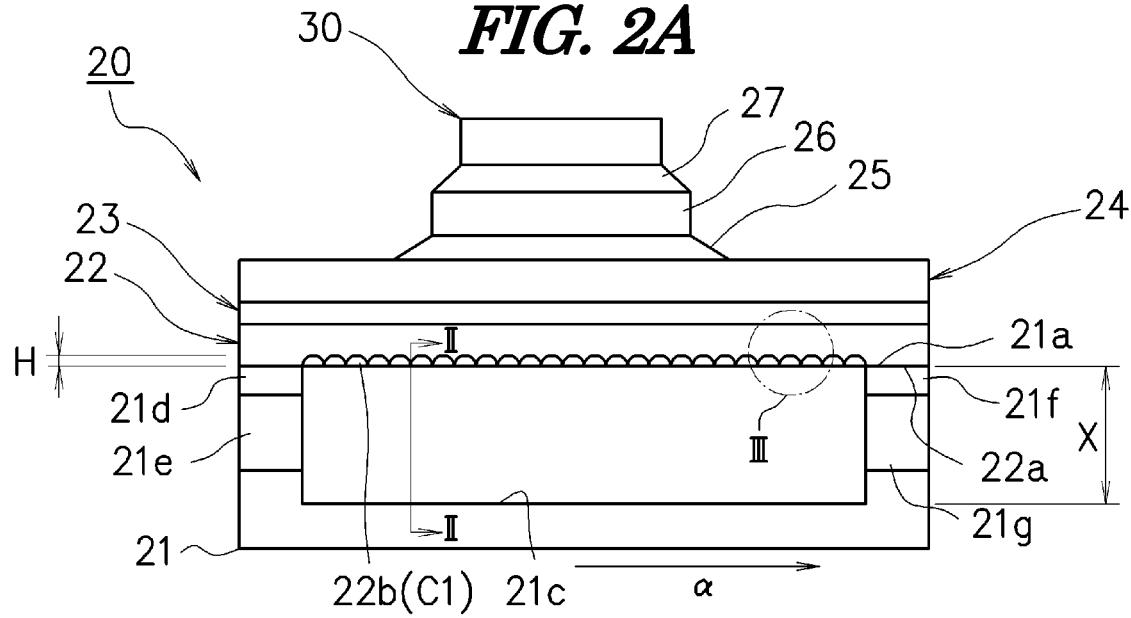
FIG. 2A is a cross-sectional view taken along the line I-I of FIG. 1, showing the structure of an inverter included in the cooling system.
Figure 2B:
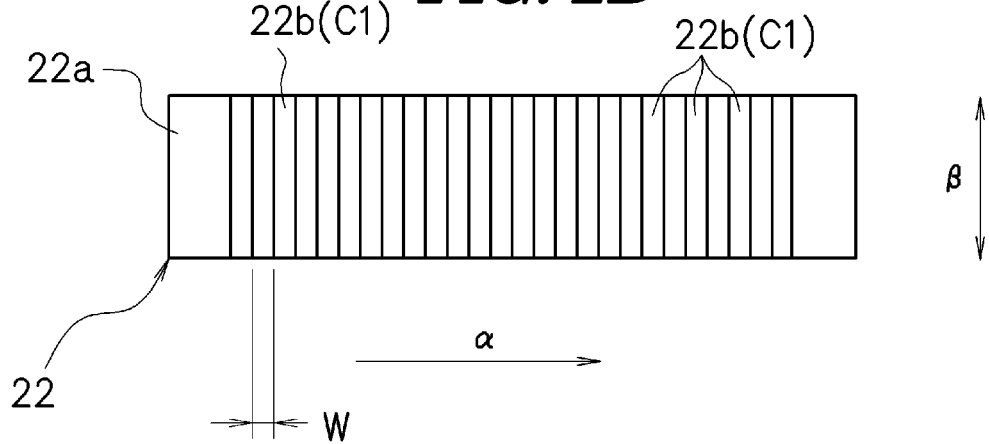
FIG. 2B is an explanatory diagram of a flow contact surface of a cooler.
Figure 3:
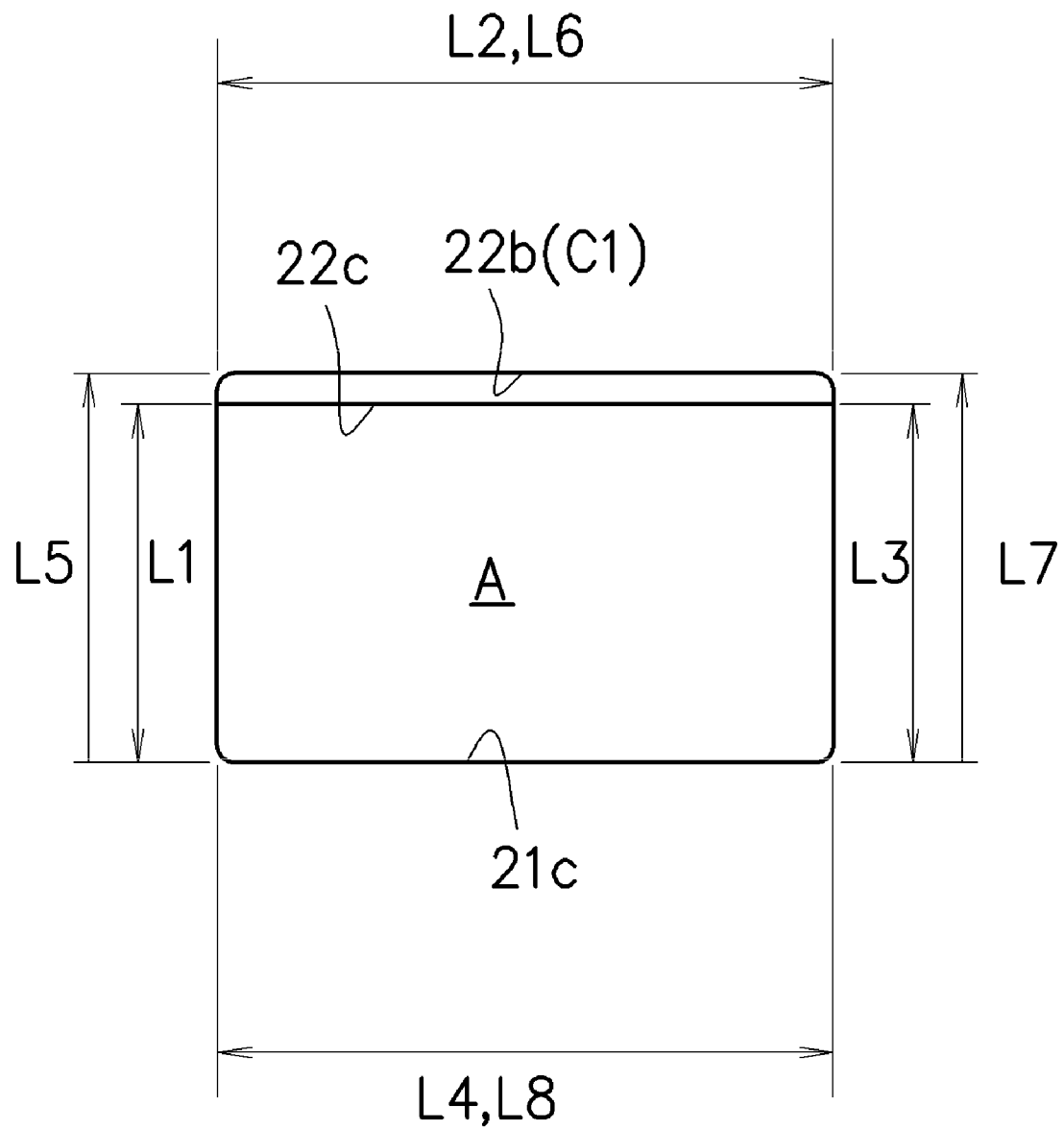
FIG. 3 is a cross-sectional view taken along the line II-II of FIG. 2A.

In the following, embodiments of the present invention will be described with reference to the accompanying drawings. FIG. 1 shows an explanatory diagram of the structure of a cooling system to which a cooling structure according to one embodiment of the present invention is applied. FIG. 2A is a cross-sectional view taken along the line I-I of FIG. 1, showing the structure of an inverter included in the cooling system. FIG. 2B is an explanatory diagram of a flow contact surface of a cooler. FIG. 3 is a cross-sectional view taken along the line II-II of FIG. 2A.

As shown in FIG. 1, a cooling system A in one example includes a radiator 10, a water-cooling motor 11, a DC-DC converter 12, an inverter 20, an electric pump 13, and a controller B.

The water-cooling motor 11, the DC-DC converter 12, the inverter 20 and the electric pump 13 are connected to the output side of the controller B to be appropriately controlled. The controller B includes a central processing unit (CPU), an interface circuit, and the like, and is adapted to exhibit a required function by execution of a predetermined program.

In this embodiment, the inverter 20 is a power converter that electrically generates AC power from DC power. As shown in FIG. 2A, the inverter 20 includes a laminate formed by stacking a water jacket 21, a cooler 22, an electrically insulating material 23, a bus bar 24 made of copper or the like, a solder layer 25, a thermal buffer plate 26 made of copper, molybdenum etc., a solder layer 27, and a semiconductor chip 30 acting as a heat generating element in that order.

A sidewall 21d on a cooling fluid inlet side of the water jacket 21 is provided with an inlet 21e for inflow of the cooling fluid, whereas a sidewall 21f on a cooling fluid outlet side of the water jacket 21 is provided with an outlet 21g for outflow of the cooling fluid. The water jacket 21 allows the cooling fluid to circulate there through via the above inlet 21e and outlet 21g in the direction indicated by reference character "cc" in FIGS. 1 and 2.

The cooler 22 is formed in a plate-like shape. A cooling structure according to one embodiment of the present invention is provided in a flow contact surface 22a facing the inside of the water jacket 21. The cooling structure in one embodiment of the present invention has a function of cooling a semiconductor chip 30 serving as the heat generating element by allowing the cooling fluid to flow and make contact with the cooler 22 which is a base material with the semiconductor chip 30 disposed thereon. The cooling structure is provided with a vortex-flow generating portion C1 extending in a direction 13 intersecting a circulation direction cc of the cooling fluid and adapted to generate a vortex flow depending on the flow rate of the cooling fluid.

In this embodiment, the semiconductor chip 30 as the heat generating element is placed over the cooler 22 as the base material via the insulating material 23, bus bar 24, solder layer 25, buffer plate 26, and solder layer 27 described above. The buffer plate 26 is to buffer a difference in coefficient of linear expansion from the semiconductor chip 30.

The vortex-flow generating portion C1 extends in the direction intersecting the circulation direction of the cooling fluid, and has a function of generating a vortex flow depending on the flow rate of the cooling fluid. In this embodiment, a plurality of grooves 22b having a concave shape with a semicircular section are continuously formed at predetermined intervals on the flow contact surface 22a of the cooler 22 (see FIG. 2). In this embodiment, the two adjacent grooves 22b and 22b are arranged by the predetermined interval, while adjacent inner walls for partitioning the grooves intersect each other so as to satisfy the following conditions.

The expression "concave portions are continuously formed" as used herein implies not only the arrangement in which the inner walls of the adjacent concave portions intersect each other, but also the form in which the inner walls of the adjacent concave portions do not intersect. In the case of the form in which the inner walls of the adjacent concave portions do not intersect, the ends of the inner walls of the adjacent concave portions may be continuously connected together via a curved surface or the like. When the inner wall ends of the adjacent concave portions are smoothly connected to each other via the curved surface or the like, machine processing might be readily made.

The expression "inner walls intersect" as used herein means not only the state in which the inner peripheral wall surfaces of the grooves, whose concave portion has semicircular section, abut against each other on the flow contact surface, like when the grooves are arranged at certain intervals of the diameter of the concave portion, but also a state in which the grooves are arranged at intervals equal or less than the diameter of the concave portion. In this case, the inner peripheral wall surfaces of the adjacent grooves intersect at the flow contact face or thereunder. The sectional shape of the concave portion is not limited to be semicircular in section as mentioned above, and may be an irregular shape, or a combination of these shapes. That is, as long as the concave portion generates the vortex flow according to the flow rate of the cooling fluid, it may be any recessed portion.

The term "predetermined intervals" as used herein means not only the certain intervals, but also irregular intervals among all or parts of the concave portions. By forming the two adjacent grooves 22b and 22b at predetermined intervals such that the inner walls for partitioning these grooves intersect, more grooves 22b can be formed, thereby more vortex flows can be generated.

(1) A maximum height H of the groove (concave portion) 22b (see FIG. 2) is set larger than a thickness $\delta_b$ of a laminar sublayer in vicinity of a wall surface which is calculated from a Reynolds number Re and a representative length d as fluidization conditions by the following formula: $\delta_b=63.5/(Re^{7/8}) \times d$.

(2) $W^+=Wu_\tau/\nu$ is set within a range of 25 to 300, wherein $W^+=Wu_\tau/\nu$ is a value given by non-dimensionalizing an opening width W of the groove 22b by using a shear rate of $u_\tau=(\tau_\omega/\rho)^{1/2}$ calculated from a shear stress $\tau_\omega$ and a fluid density $\rho$; an experimental formula of a pipe friction coefficient represented by $C_f=t_\omega/(0.5\rho u^2)=0.73 \, Re^{-0.25}$ calculated from a flow rate u, the fluid density $\rho$, and the Reynolds number Re; and a kinematic viscosity $\nu$.

(3) The maximum height H of the groove 22b is set smaller than a distance X from the flow contact surface to a flow passage surface opposed thereto (bottom wall surface 21c).

(4) The representative length d=4A/L calculated by a minimum flow passage sectional area A and a maximum wetted perimeter length L of a flow passage section perpendicular to the circulation direction of the cooling fluid is set large. The minimum flow passage sectional area A is a sectional area partitioned by outlines L1, L2, L3, and L4 shown in FIG. 3. The outlines L1 and L3 have the same length as a distance between the bottom wall surface 21c and a top part of the convex portion 22c. The outlines L2 and L4 have the same length as the groove 22b. The term "wetted perimeter length L" as used herein is a length of the outline of the section of the flow passage partitioned by the outlines L5, L6, L7, and L8 in contact with the cooling fluid (shown in FIG. 3). The outlines L5 and L7 have the same length as a distance between the bottom wall surface 21c and a bottom part of the concave portion 22b. The outlines L6 and L8 have the same length as the concave portion 22b.

(5) The representative length d=4A/L is set to 0.004 or more. Preferably, the representative length d=4A/L is set to 0.007 or more.

(6) The dimensionless width $W^+$ is set in a range from 40 to 150, wherein $W^+$ is a value given by non-dimesionalizing a width of a back part of the groove 22b in the direction $\beta$, which is perpendicular to the circulation direction cc of the cooling fluid.

(7) The length of the convex portion with respect to the circulation direction cc of the cooling fluid becomes smaller towards the tip end of the convex portion, and the area of the tip end of the convex portion, which is flat with respect to a flow direction, is small, and the concave and convex shape is continuous with respect to the flow direction of the cooling fluid.

The cooling structure with the structure described above can have the following effects.

The cooling structure is provided with a vortex-flow generating portion, which extends in the direction intersecting the circulation direction of the cooling fluid, and which generates a vortex flow according to a flow rate of the cooling fluid. Therefore, the vortex flow generated by the vortex-flow generating portion can stir the cooling fluid in the vicinity of the heat generating element or the base material with the heat generating element disposed thereon to promote the heat transfer.

The maximum height H of the groove (concave portion) 22b is set larger than a thickness $\delta_b$ of a laminar sublayer in the vicinity of a wall surface calculated from a Reynolds number Re and a representative length d as fluidization conditions by the following formula: $\delta_b=63.5/(Re^{7/8}) \times d$. Thus, the heat transfer can be promoted in a thickness of the laminar sublayer or more in the vicinity of the heat generating element or the base material with the heat generating element disposed thereon.

$W^+=Wu_\tau/\nu$ is set within a range of 25 to 300, wherein $W^+=Wu_\tau/\nu$ is a value given by non-dimensionalizing an opening width W of the groove 22b by using a shear rate of $u_\tau=(\tau_\omega/\rho)^{1/2}$ calculated from a shear stress $\tau_\omega$ and a fluid density $\rho$; an experimental formula of a pipe friction coefficient represented by $C_f=t_\omega/(0.5\rho u^2)=0.73 \, Re^{-0.25}$ calculated from a flow rate u, the fluid density $\rho$, and the Reynolds number Re; and a kinematic viscosity $\nu$. Thus, improvement of the heat transfer efficiency can be achieved.

The representative length d=4A/L is set to 0.004 or more, wherein A is the minimum flow passage sectional area and L is the maximum wetted perimeter length of the flow passage section perpendicular to the circulation direction of the cooling fluid. Therefore, a shearing force of a wall surface is reduced, thereby suppressing the increase in loss of pressure.

By forming the groove to intersect the circulation direction of the cooling fluid, the vortex flow is formed in the entire region of the flow contact surface, which intersects the above circulation direction, thereby promoting the heat transfer.

By setting the width of the groove, which has an opening on the surface where the cooling fluid flows, to a predetermined value, further improvement of the heat transfer performance is achieved.

By continuously forming the groove in the direction perpendicular to the circulation direction of the cooling fluid, the frequency of vortex flow occurrence with respect to the circulation direction is increased, thereby promoting the heat transfer.

The groove is provided in a concave shape at the flow contact surface of the cooler, which can further reduce the size of the heat generating element or base material to which the cooling structure is applied.

Figure 4A:
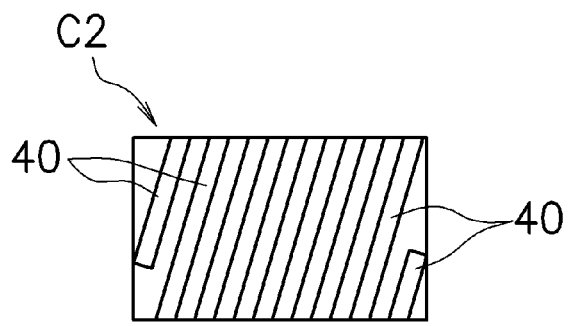
FIG. 4A is an explanatory diagram showing a vortex-flow generating portion according to a first modified example.
Figure 4B:
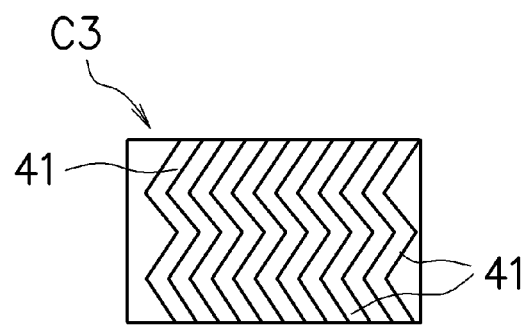
FIG. 4B is an explanatory diagram showing a vortex-flow generating portion according to a second modified example.

Next, a modified example of the vortex-flow generating portion will be described with reference to FIGS. 4A to 4D. FIG. 4A is an explanatory diagram of a vortex-flow generating portion in a first modified example, FIG. 4B is an explanatory diagram of a vortex-flow generating portion according to a second modified example, FIG. 4C is an explanatory diagram of a vortex-flow generating portion according to a third modified example, and FIG. 4D is an explanatory diagram of a vortex-flow generating portion according to a fourth modified example.

The vortex-flow generating portion C2 of the first modified example, shown in FIG. 4A, is provided with linear grooves 40 formed in an oblique manner at certain intervals in the circulation direction cc of the cooling fluid. The vortex-flow generating portion C3 of the second modified example, shown in FIG. 4B, is provided with grooves 41 formed perpendicular to the circulation direction cc and in a zigzag manner at certain intervals.

Figure 4C:
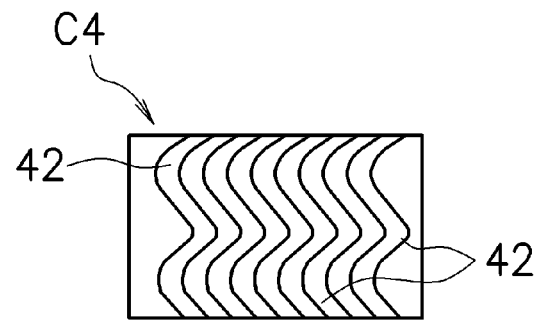
FIG. 4C is an explanatory diagram showing a vortex-flow generating portion according to a third modified example.
Figure 4D:
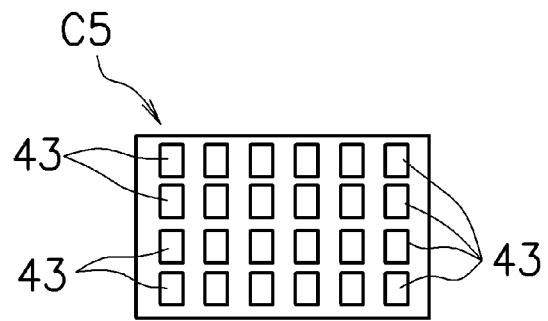
FIG. 4D is an explanatory diagram showing a vortex-flow generating portion according to a fourth modified example.

The vortex-flow generating portion C4 of the third modified example, shown in FIG. 4C, is provided with wave-shaped grooves 42 formed perpendicular to the circulation direction cc at certain intervals. The vortex-flow generating portion C5 of the fourth modified example, shown in FIG. 4D, is provided with linear and discontinuous grooves 43 formed perpendicular to the circulation direction cc at certain intervals.

Example 1

Figure 5:
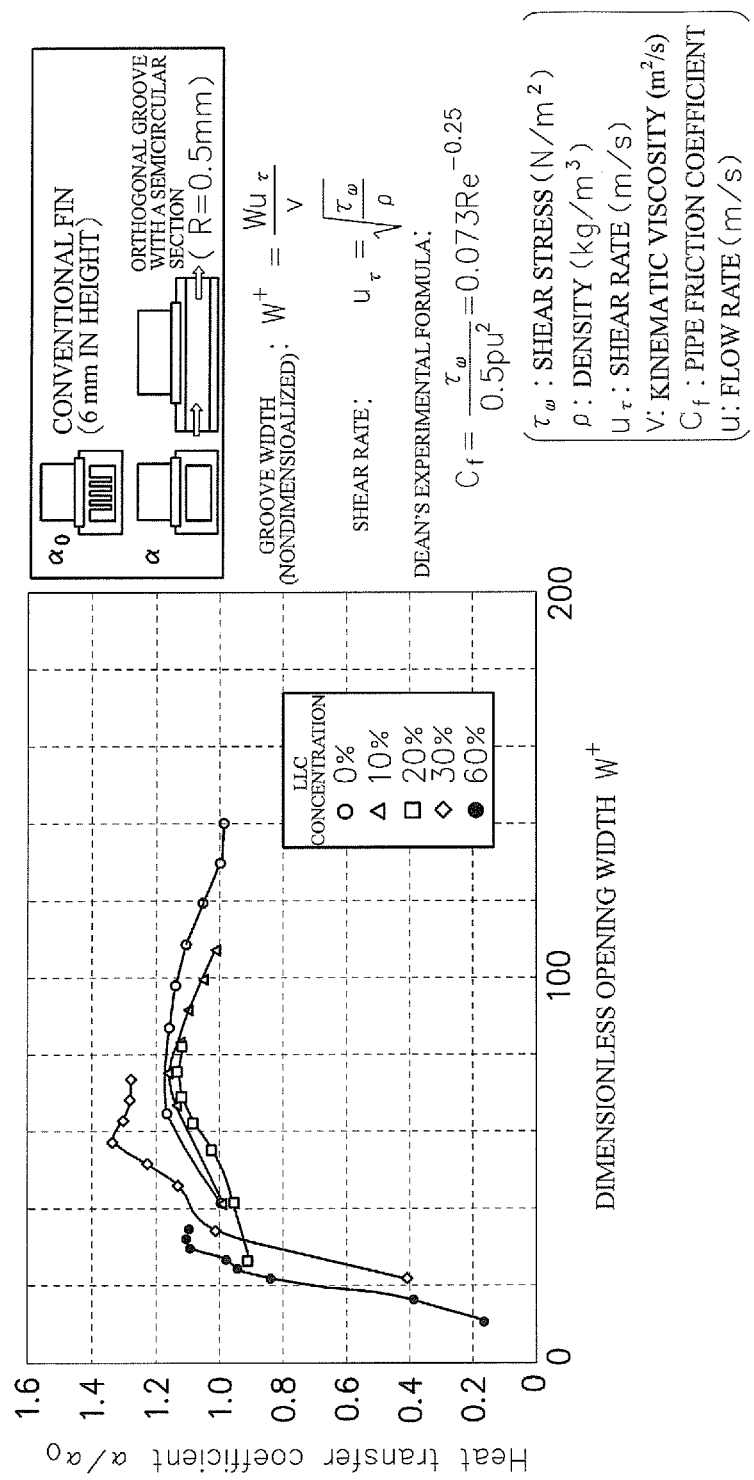
FIG. 5 is a diagram showing the heat transfer coefficient at the same loss in pressure with respect to a conventional fin shape.
Figure 6:
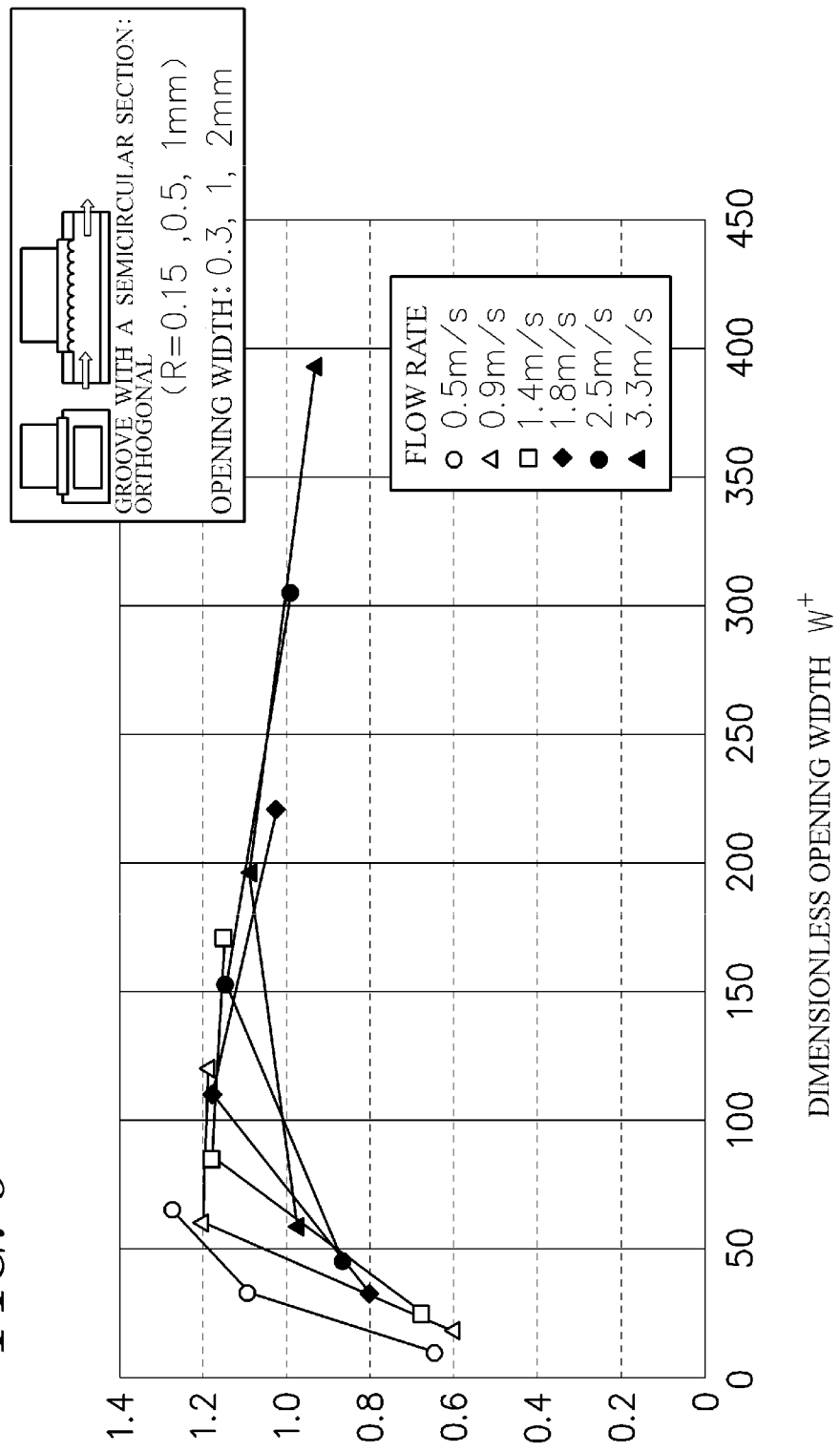
FIG. 6 is a diagram showing the rate of increase in heat transfer coefficient relative to an average heat transfer coefficient at respective flow rates of cooling fluid.

FIG. 5 is a diagram showing the heat transfer coefficient at the same loss in pressure with respect to a conventional fin shape. FIG. 6 is a diagram showing the rate of increase in heat transfer coefficient relative to an average heat transfer coefficient at respective flow rates of cooling fluid. As can be seen from FIG. 5, there is a width of a groove that improves the heat transfer performance for a conventional fin under the same loss in pressure. Further, as can be seen from FIG. 6, there is an optimum range of $W^+$ with respect to the heat transfer coefficient of the orthogonal groove at the same flow rate.

Figure 7A:
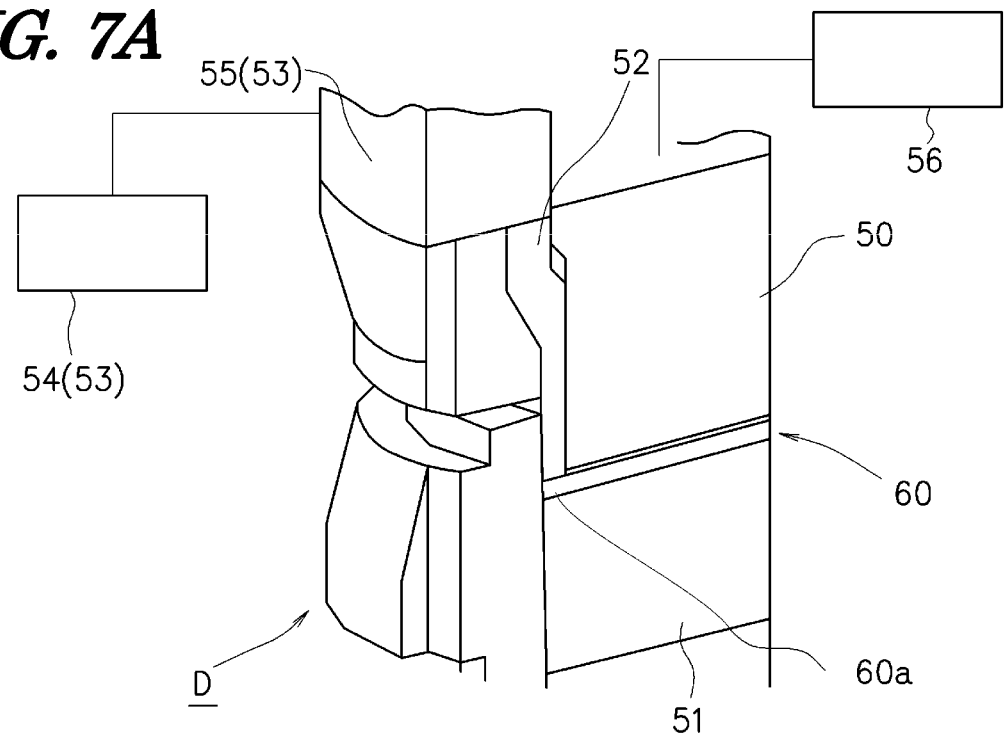
FIG. 7A is a partial perspective view of a molding apparatus for a vortex-flow forming plate at the start of molding.
Figure 7B:
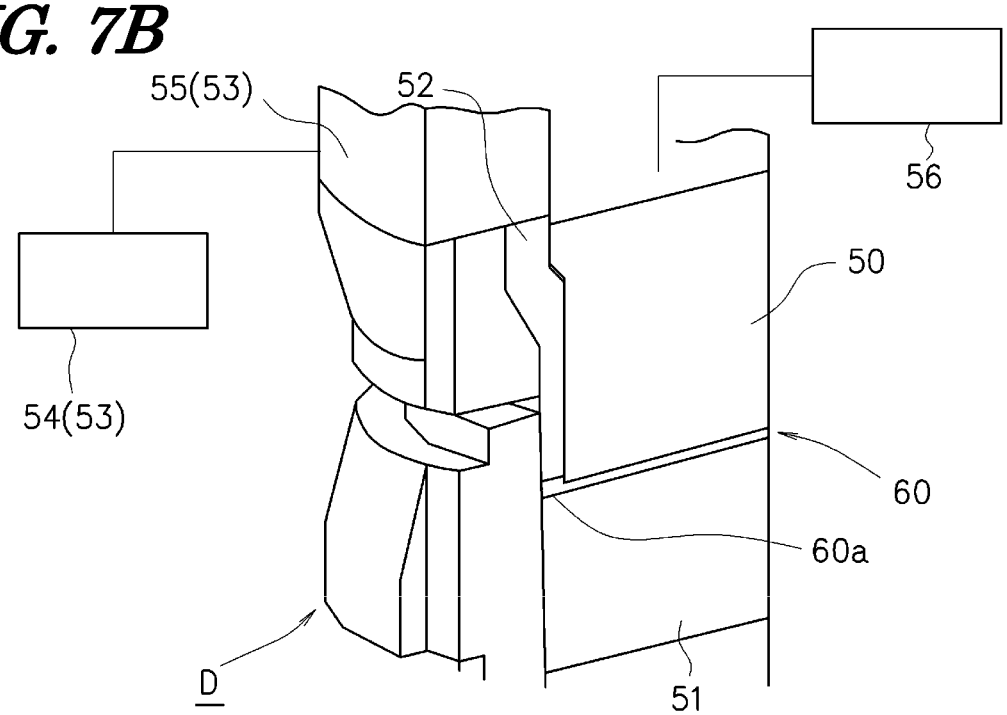
FIG. 7B is a partial perspective view of the molding apparatus for a vortex-flow forming plate upon completion of molding.
Figure 8A:
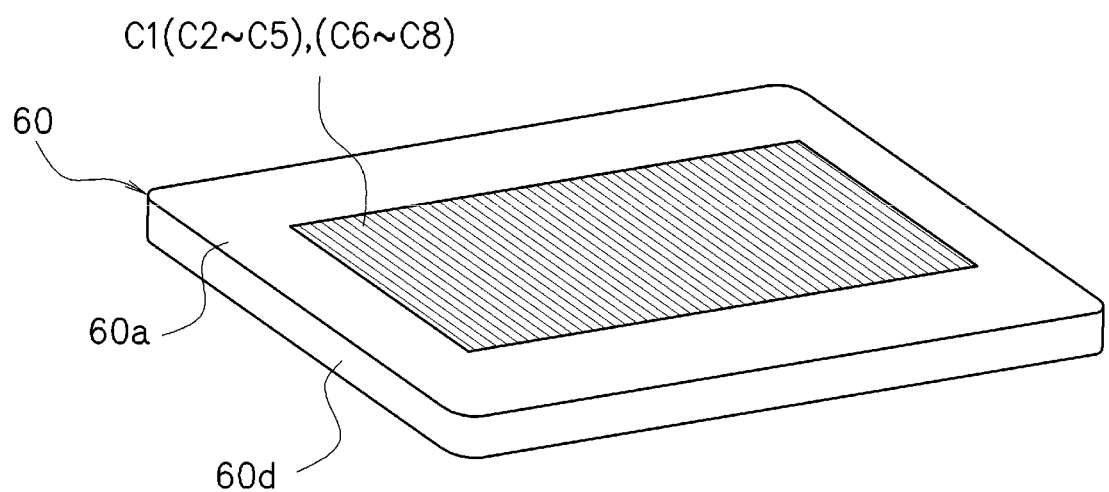
FIG. 8A is a perspective view of a vortex-flow forming plate with a vortex-flow generating portion molded therein.
Figure 8B:
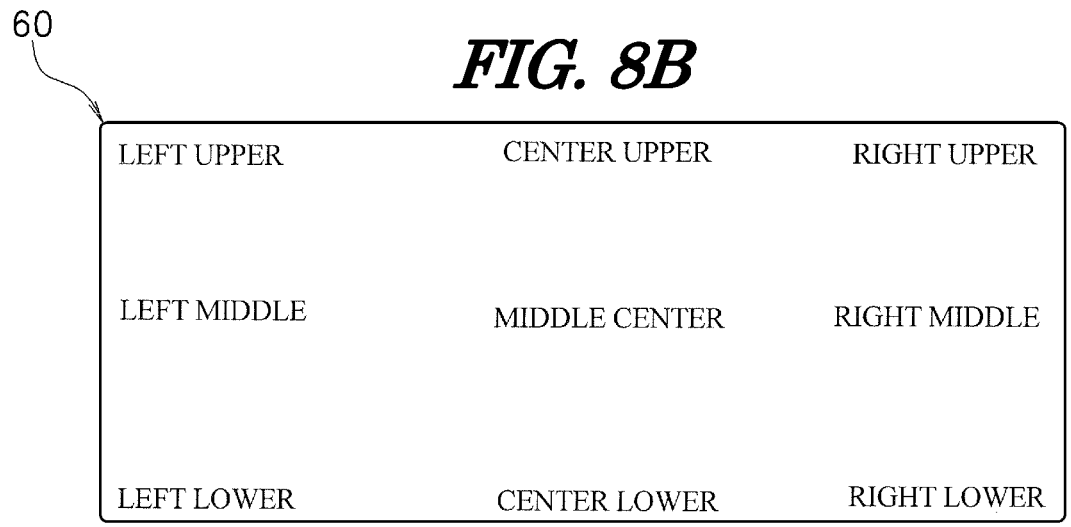
FIG. 8B is a plan view of a backside of a formation surface for the vortex-flow generating portion of the vortex-flow forming plate.

The above-mentioned vortex-flow generating portion is molded by the molding apparatus for the vortex-flow forming plate shown in FIGS. 7A and 7B. FIG. 7A is a partial perspective view of the molding apparatus for the vortex-flow forming plate at the start of molding; and FIG. 7B is a partial perspective view of the molding apparatus for the vortex-flow forming plate upon completion of molding. FIG. 8A is a perspective view of a vortex-flow forming plate with the vortex-flow generating portion molded therein, and FIG. 8B is a plan view of a backside of a formation surface for the vortex-flow generating portion of the vortex-flow forming plate.

A vortex-flow forming plate molding apparatus D molds the vortex-flow generating portions C1 (C2 to C5) described above and vortex-flow generating portions C6 to C8 to be described later in a vortex-flow forming plate 60 serving as a cooler. The vortex-flow forming plate molding apparatus D includes a vertically movable upper die 50 to form the vortex-flow generating portions C1 to C8, a fixed lower die 51, a sleeve 52 for pressing an outer peripheral edge 60$a$ of the vortex-flow forming plate 60 (see FIG. 8) disposed between the upper die 50 and the lower die 51, and a back-pressure applicator 53, which applies a back pressure to between the sleeve 52 and the lower die 51.

The vortex-flow forming plate 60 in this embodiment is formed of copper or a copper alloy with ductility. However, other ductile materials may be employed. By forming the vortex-flow forming plate 60 with copper or a copper alloy, the vortex-flow generating portion C can be readily molded.

"The outer peripheral edge 60$a$ of the vortex-flow forming plate 60" is an outer region enclosing the vortex flow generating portion C1 (C2 to C8), as shown in FIG. 8A. The sleeve 52 is formed in a thick ring shape and comes in contact with the outer peripheral edge portion 60$a$.

The back-pressure applicator 53 in this embodiment includes a hydraulic cylinder 54 for applying a back pressure, and a pressing member 55 for pressing the sleeve 52 by the hydraulic cylinder 54. The hydraulic cylinder 54 is connected to the output side of the controller (not shown), and thus is controlled to be driven to apply a predetermined back pressure to between the sleeve 52 and the lower die 51. Further, a hydraulic cylinder 56 is connected to the output side of the controller as well as the upper die 50, and thus is controlled to be appropriately driven.

According to a molding method for molding the vortex-flow generating portion using the vortex-flow forming plate molding apparatus D with the above-mentioned structure, the outer peripheral edge 60$a$ of the vortex-flow forming plate 60 disposed between the upper and lower dies 50 and 51 is pressed by applying a back pressure via the sleeve 52 and the lower die 51, and then the vortex-flow generating portion C is molded on the vortex-flow forming plate 60 by the upper and lower dies 50 and 51.

Figure 9:
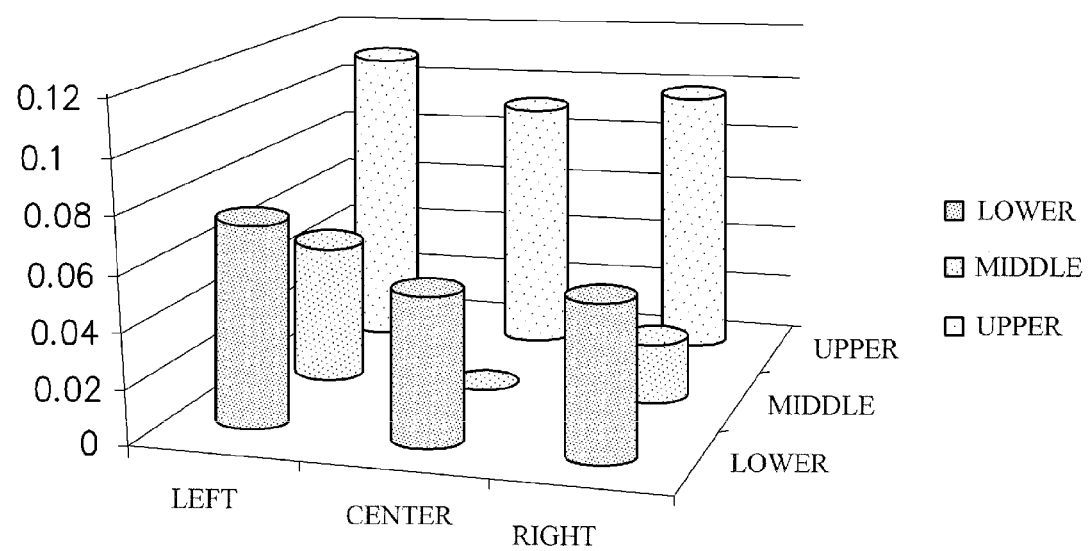
FIG. 9 is a bar graph showing amounts of curvature at respective positions on the backside of the vortex-flow forming plate shown in FIG. 8B relative to the center of the plate.
Figure 10:
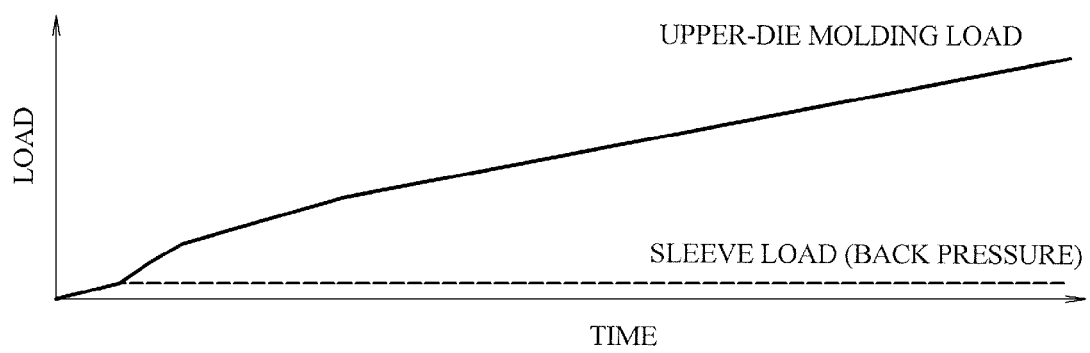
FIG. 10 is a graph showing changes over time in back-pressure applied to between a sleeve and a lower die, and in molding load applied to between the upper and lower dies.

FIG. 9 is a bar graph showing amounts of curvature at respective positions on the backside of the vortex-flow forming plate shown in FIG. 8B relative to the center of the plate. FIG. 10 is a graph showing changes over time in back-pressure applied to between a sleeve and a lower die, and in molding load applied to between the upper and lower dies.

The bar graph of FIG. 9 shows amounts of curvature in respective positions of the backside of the vortex-flow generating portion in the vortex-flow forming plate 60 shown in FIG. 8B, namely, "left upper", "center upper", "right upper", "left middle", "right middle", "left lower", "center lower", and "right lower" with respect to the "middle center" thereof.

As shown in FIG. 10, a substantially constant back pressure is applied to between the sleeve 52 and the lower die 51 from the start of molding, whereas a load applied to between the upper and lower dies 50 and 51 is gradually increased. By molding the vortex-flow generating portions C1 (C2 to C8), while the outer peripheral edge 60$a$ of the vortex-flow forming plate 60 is pressed by the lower die 51 and the sleeve 52 with the substantially constant back pressure as described above, the amount of curvature of the vortex-flow forming plate 60 can be made 0.1 mm or less, as shown in FIG. 9. Thus, the semiconductor or the like can be mounted as it is without applying an additional process, including reformation of the vortex-flow forming plate 60.

Figure 11A:
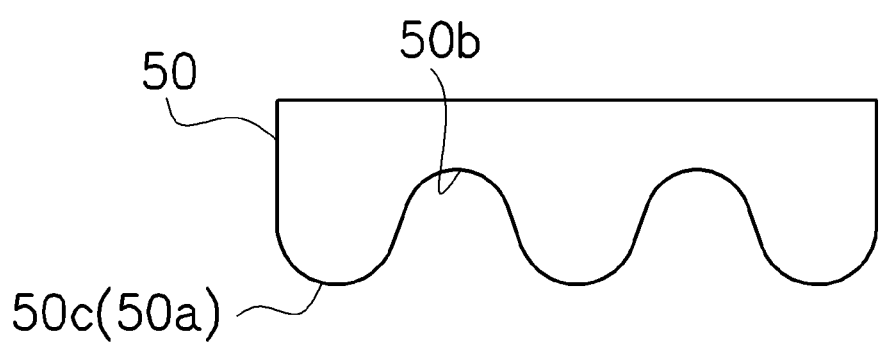
FIG. 11A is a partial enlarged cross-sectional view of a molding part formed in the upper die for molding the vortex-flow generating portion.
Figure 11B:
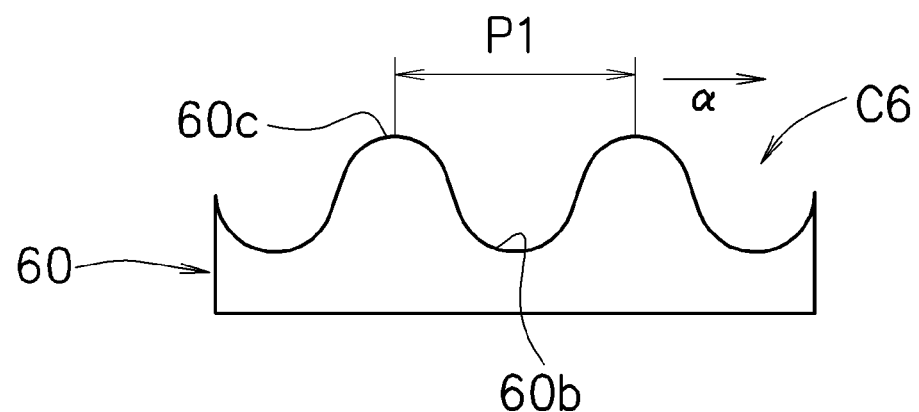
FIG. 11B is an enlarged view of a vortex-flow generating portion in a first other example corresponding to the part of the vortex-flow generating portion enclosed by a line III in FIG. 2.
Figure 12A:
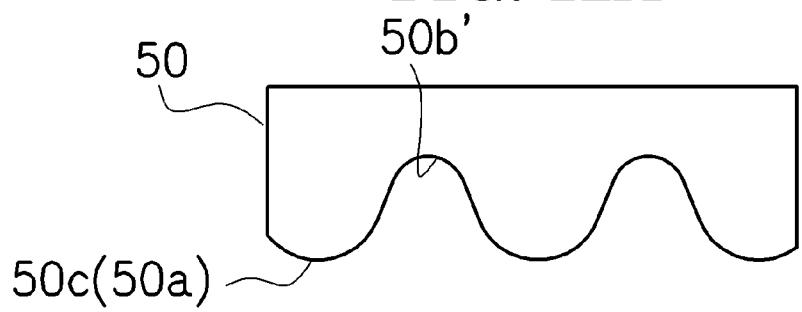
FIG. 12A is a partial enlarged cross-sectional view of a molding part formed in an upper die for molding the vortex-flow generating portion.

Next, a description will be given of other forms of a convex portion formed between adjacent concave portions with reference to FIGS. 11 to 13. FIGS. 11 to 13 are partial enlarged views of a convex portion formed between adjacent concave portions, wherein a tip of the convex portion is made curved surface with a certain curvature radius. Among FIGS. 11A and 11B to 13A and 13B, each FIG. with A is a partial enlarged cross-sectional view of a molding part formed in the upper die for molding the vortex-flow generating portion, and each FIG. with B is an enlarged view of a vortex-flow generating portion of first to third other examples, which corresponds to the vortex-flow generating portion enclosed by the line III in FIG. 2.

The vortex-flow generating portion C6 in the first other example shown in FIG. 11B extends in the direction intersecting the circulation direction cc of the cooling fluid, and has a function of generating a vortex flow depending on the flow rate of the cooling fluid. In this embodiment, grooves 60$b$ and convex portions 60$c$ are continuously formed at certain intervals P1 on a flow contact surface 60$d$ of the vortex flow forming plate 60. The grooves 60$b$ are a plurality of concave portions having a semicircular section with a certain curvature radius, and the convex portions 60$c$ have the same curvature radius as the groove 60$b$. In this case, a molding portion 50$a$ of the upper die 50 shown in FIG. 11A has a convex portion 50$c$ corresponding to the groove 60$b$, and a concave portion 50$b$ corresponding to the convex portion 60$c$. The curvature radius of the convex portion 50$c$ is set to the same as that of the concave portion 50$b$. "Tip of the convex portion" is a part contributing to molding of the vortex-flow generating portion C6. It is preferred that the curvature radius of the concave portion 50$b$ of the upper die 50 is set to 0.2 mm or more, from the view point of wire cutting processing.

Figure 12B:
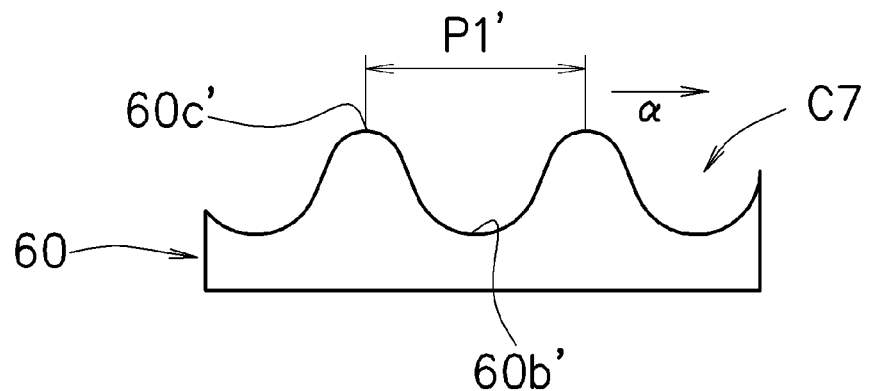
FIG. 12B is an enlarged view of a vortex-flow generating portion in a second other example corresponding to the part of the vortex-flow generating portion enclosed by a line III in FIG. 2.

In the vortex-flow generating portion C7 in the second other example shown in FIG. 12B, grooves 60$b'$ and convex portions 60$c'$ are continuously formed at certain intervals P1' on a flow contact surface 60$d$ of the vortex flow forming plate 60. The grooves 60$b'$ are a plurality of concave portions having a semicircular section with a certain curvature radius, and the convex portions 60$c'$ have larger curvature radius than the groove 60$b'$. In this case, in the molding portion 50$a$ of the upper die 50 shown in FIG. 12A, the curvature radius of a convex portion 51$c'$ corresponding to the groove 60$b'$ is the same as that of a concave portion 50$b'$ corresponding to the convex portion 60$c'$.

In the vortex-flow generating portion C8 in the third other example shown in FIG. 13B, grooves 60$b''$ and convex portions 60$c''$ are continuously formed at certain intervals P1'' on a flow contact surface 60$d$ of the vortex flow forming plate 60. The grooves 60$b''$ are a plurality of concave portions having a semicircular section with a certain curvature radius, and the convex portions 60c'' have larger curvature radius than the groove 60b''. In this case, in the molding portion 50a of the lower die 50 shown in FIG. 13A, the curvature radius of a convex portion 51c'' corresponding to the groove 60b'' is the same as that of a concave portion 50b'' corresponding to the convex portion 60c''.

With the vortex-flow generating portion described in FIGS. 7 to 13, the following effects can be obtained, in addition to the effects described above.

By forming the tip of the convex portion formed between the adjacent concave portions in a curved surface having a certain curvature radius, wear caused by erosion can be suppressed, and the vortex-flow generating portion can be readily processed. Further, the occurrence of cracks or breakage in the die can be suppressed. Since the tip of the convex portion has no corner or edge, when an anti-rust coating is formed over the surface of the vortex-flow generating portion, the average thickness of the anti-rust coating can be easily controlled.

The present invention is not limited to the embodiments described above, and various modifications and changes mentioned below can be made. The above embodiments describes the example of the cooling structure applied to an inverter, as an example of the cooling structure for cooling a heat generating element by allowing cooling fluid to circulate around a base material with the heat generating element disposed thereon. However, it is needless to say that the present invention may be directly applied to a motor or the like as the heat generating element.

The invention claimed is:

1. A cooling structure to cool a heat generating element by allowing a cooling fluid to flow and come into contact with the heat generating element or a base material with the heat generating element disposed thereon, comprising:
   a vortex-flow generating portion, which extends in a direction intersecting a circulation direction of the cooling fluid, and which generates a vortex flow in accordance with a flow rate of the cooling fluid,
   wherein the vortex-flow generating portion includes a plurality of concave portions arranged at predetermined intervals,
   $W^+=Wu_\tau/\nu$ is set within a range of 25 to 300, where $W^+=Wu_\tau/\nu$ is a value given by nondimensionalizing an opening width W as measured in meters of each of the plurality of concave portions by using a shear rate of $u_\tau=(T_\omega/\rho)^{1/2}$ as measured in meters per second calculated from a shear stress $\tau_\omega$ as measured in Newtons per meter squared and a fluid density $\rho$ as measured in kilograms per meter; an experimental formula of a pipe friction coefficient, represented by $C_f=\tau_\omega/(0.5\rho u^2)=0.73$ $Re^{-0.25}$ calculated from a flow rate u as measured in meters per second, the fluid density $\rho$, and the Reynolds number Re; and a kinematic viscosity $\nu$ as measured in meters squared per second,
   wherein a maximum height H as measured in meters of each of the plurality of concave portions is set smaller than a distance X from an opening surface of each of the plurality of concave portions to a flow passage surface facing the opening surface, and
   a representative length d=4A/L is set to 0.007 m or more, wherein A as measured in meters squared is the minimum flow passage sectional area and L as measured in meters is the maximum wetted perimeter length of the flow passage section perpendicular to the circulation direction of the cooling fluid.

2. A cooling structure to cool a heat generating element by allowing a cooling fluid to flow and come into contact with the heat generating element or a base material with the heat generating element disposed thereon, comprising:
   a vortex-flow generating portion, which extends in a direction intersecting a circulation direction of the cooling fluid, and which generates a vortex flow in accordance with a flow rate of the cooling fluid,
   wherein the vortex-flow generating portion includes a plurality of concave portions arranged at predetermined intervals,
   $W^+=Wu_\tau/\nu$ is set within a range of 25 to 300, where $W^+=Wu_\tau/\nu$ is a value given by nondimensionalizing an opening width W as measured in meters of each of the plurality of concave portions by using a shear rate of $u_\tau=(T_\omega/\rho)^{1/2}$ as measured in meters per second calculated from a shear stress $\tau_\omega$ as measured in Newtons per meter squared and a fluid density $\rho$ as measured in kilograms per meter; an experimental formula of a pipe friction coefficient, represented by $C_f=\tau_\omega/(0.5\rho u^2)=0.73$ $Re^{-0.25}$ calculated from a flow rate u as measured in meters per second, the fluid density $\rho$, and the Reynolds number Re; and a kinematic viscosity $\nu$ as measured in meters squared per second,
   wherein a maximum height H as measured in meters of each of the plurality of concave portions is set smaller than a distance X from an opening surface of each of the plurality of concave portions to a flow passage surface facing the opening surface, and
   a representative length d=4A/L is set to 0.004 m or more, wherein A as measured in meters squared is the minimum flow passage sectional area and L as measured in meters is the maximum wetted perimeter length of the flow passage section perpendicular to the circulation direction of the cooling fluid.

3. The cooling structure according to claim 2, wherein the maximum height H of each of the plurality of concave portions is also set larger than a thickness $\delta_b$ as measured in meters of a laminar sublayer in the vicinity of a wall surface, calculated from a Reynolds number Re and a representative length d as fluidization conditions by the following formula: $\delta_b=63.5/(Re^{7/8})\times d$.

4. The cooling structure according to claim 2, wherein dimensionless width $W^+$ is set in a range from 40 to 150, wherein $W^+$ is a value given by nondimesionalizing a width of each of the plurality of concave portions in the direction perpendicular to the circulation direction of the cooling fluid.

5. The cooling structure according to claim 2, wherein adjacent concave portions are formed such that inner walls for partitioning the adjacent concave portions intersect each other.

6. The cooling structure according to claim 2, wherein the plurality of convex portions of the vortex-flow generating portion are grooves formed on a flow contact surface, which comes in contact with flow of the cooling fluid for cooling the heat generating element or the base material with the heat generating element disposed thereon.

7. The cooling structure according to claim 2, wherein each of the plurality of concave portions has a semicircular sectional shape.

8. The cooling structure according to claim 2, wherein a tip of each of the plurality of convex portions formed between the adjacent concave portions is formed in a curved surface with a certain curvature radius.

9. The cooling structure according to claim 8, wherein the curvature radius of the tip of each of the plurality of convex portions is 0.2 mm or more.

10. The cooling structure according to claim 2, wherein the vortex-flow generating portion is molded on a vortex-flow forming plate made of copper or a copper alloy.

11. A vortex-flow forming plate molding apparatus for molding the vortex-flow generating portion according to claim 2 on a vortex-flow forming plate, comprising:
- a vertically movable upper die to form the vortex-flow generating portion;
- a fixed lower die;
- a sleeve for pressing an outer peripheral edge of the vortex-flow forming plate disposed between the upper die and the lower die; and
- a back-pressure applicator for applying a back pressure to between the sleeve and the lower die, wherein
- the outer peripheral edge of the vortex-flow forming plate is pressed by the sleeve and the lower die, the back pressure being applied on the sleeve and the lower die, and
- the vortex-flow generating portion is molded on the vortex-flow forming plate by the upper die and the lower die.

12. A method for molding a vortex-flow generating portion using the vortex-flow forming plate molding apparatus according to claim 11, wherein
- the outer peripheral edge of the vortex-flow forming plate, disposed between the upper die and the lower die, is pressed by the sleeve and the lower die, the back pressure being applied on the sleeve and the lower die, and
- the vortex-flow generating portion is molded on the vortex-flow forming plate by the upper die and the lower.

\* \* \* \* \*